United States Patent
Nagase et al.

(10) Patent No.: US 9,764,416 B2
(45) Date of Patent: Sep. 19, 2017

(54) POWER MODULE SUBSTRATE, HEAT-SINK-ATTACHED POWER MODULE SUBSTRATE, AND HEAT-SINK-ATTACHED POWER MODULE

(71) Applicant: MITSUBISHI MATERIALS CORPORATION, Tokyo (JP)

(72) Inventors: Toshiyuki Nagase, Gotenba (JP); Yoshiyuki Nagatomo, Saitama (JP); Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 7 days.

(21) Appl. No.: 14/761,697

(22) PCT Filed: Jan. 20, 2014

(86) PCT No.: PCT/JP2014/050934
§ 371 (c)(1),
(2) Date: Jul. 17, 2015

(87) PCT Pub. No.: WO2014/115677
PCT Pub. Date: Jul. 31, 2014

(65) Prior Publication Data
US 2015/0366048 A1    Dec. 17, 2015

(30) Foreign Application Priority Data

Jan. 22, 2013  (JP) .................................. 2013-009199
Oct. 17, 2013  (JP) .................................. 2013-216783

(51) Int. Cl.
*H05K 1/00*     (2006.01)
*B23K 20/02*   (2006.01)
(Continued)

(52) U.S. Cl.
CPC .......... *B23K 20/02* (2013.01); *H01L 23/3735* (2013.01); *H01L 23/3736* (2013.01);
(Continued)

(58) Field of Classification Search
CPC .. H05K 1/02; H05K 1/09; H05K 7/00; H05K 7/20; H01L 23/00; H01L 23/34; H01L 23/48; H01L 23/495; B23K 31/02
(Continued)

(56) References Cited

U.S. PATENT DOCUMENTS 5,130,498 A * 7/1992 Yoshida .............. H01L 23/3735
                                                    174/252
6,033,787 A * 3/2000 Nagase ................... B32B 15/04
                                                    228/121
(Continued)

FOREIGN PATENT DOCUMENTS

JP    04-162756 A    6/1992
JP    8-255973 A    10/1996
(Continued)

OTHER PUBLICATIONS

International Search Report mailed Mar. 4, 2014, issued for PCT/JP2014/050934 and English translation thereof.
(Continued)

*Primary Examiner* — Xiaoliang Chen
(74) *Attorney, Agent, or Firm* — Locke Lord LLP; James E. Armstrong, IV; Nicholas J. DiCeglie, Jr.

(57) ABSTRACT

The power module substrate includes a circuit layer that is formed on a first surface of a ceramic substrate, and a metal layer that is formed on a second surface of the ceramic substrate, in which the metal layer has a first aluminum layer that is bonded to the second surface of the ceramic substrate and a first copper layer that is bonded to the first aluminum layer by solid-phase diffusion bonding.

25 Claims, 9 Drawing Sheets

(51) Int. Cl.
    *H01L 23/373* (2006.01)
    *H01L 23/40* (2006.01)
    *H01L 23/473* (2006.01)
    *B23K 101/40* (2006.01)
    *B23K 103/10* (2006.01)
    *B23K 103/12* (2006.01)
    *B23K 103/18* (2006.01)
    *B23K 103/00* (2006.01)

(52) U.S. Cl.
    CPC ........ *H01L 23/4006* (2013.01); *H01L 23/473* (2013.01); *B23K 2201/40* (2013.01); *B23K 2203/10* (2013.01); *B23K 2203/12* (2013.01); *B23K 2203/18* (2013.01); *B23K 2203/52* (2015.10); *H01L 2224/32225* (2013.01); *H01L 2924/13055* (2013.01)

(58) Field of Classification Search
    USPC ........ 174/252, 256, 258, 259; 428/210, 469, 428/545; 361/720, 728, 715; 257/668, 257/701, 789, 792
    See application file for complete search history.

(56) References Cited

U.S. PATENT DOCUMENTS

| | | | | |
|---|---|---|---|---|
| 6,309,737 B1* | 10/2001 | Hirashima | ............ | C04B 37/026 174/258 |
| 7,969,021 B2* | 6/2011 | Uno | ............ | B21C 37/042 174/126.1 |
| 8,120,153 B1* | 2/2012 | Shen | ............ | H01L 21/565 257/677 |
| 8,448,842 B1* | 5/2013 | Wu | ............ | B23K 20/021 205/163 |
| 2002/0066953 A1* | 6/2002 | Ishiwata | ............ | H01L 23/34 257/700 |
| 2002/0074902 A1* | 6/2002 | Kitajima | ............ | G11B 5/5552 310/328 |
| 2002/0130161 A1* | 9/2002 | Schmitt | ............ | B23K 35/001 228/124.1 |
| 2007/0160858 A1* | 7/2007 | Fukuda | ............ | C04B 37/025 428/469 |
| 2010/0147571 A1* | 6/2010 | Kluge | ............ | C04B 37/005 174/259 |
| 2010/0213619 A1* | 8/2010 | Uno | ............ | H01L 24/43 257/780 |
| 2010/0277873 A1* | 11/2010 | Eisele | ............ | H01L 23/49568 361/728 |
| 2012/0001336 A1* | 1/2012 | Zeng | ............ | H01L 24/05 257/769 |
| 2012/0202090 A1* | 8/2012 | Yamamoto | ............ | B23K 1/19 428/651 |
| 2013/0010429 A1* | 1/2013 | Tonomura | ............ | H01L 23/3735 361/720 |
| 2013/0071686 A1* | 3/2013 | Oda | ............ | B32B 15/017 428/652 |
| 2013/0309919 A1* | 11/2013 | Oda | ............ | H01M 2/206 439/883 |
| 2013/0319569 A1* | 12/2013 | Kikuno | ............ | B23K 1/0012 138/109 |
| 2014/0192486 A1* | 7/2014 | Kuromitsu | ............ | H01L 23/3735 361/715 |

FOREIGN PATENT DOCUMENTS

| | | |
|---|---|---|
| JP | 2002-064169 A | 2/2002 |
| JP | 2003-078086 A | 3/2003 |
| JP | 2004-241567 A | 8/2004 |
| JP | 4037425 B2 | 1/2008 |
| JP | 4629016 B2 | 2/2011 |
| JP | 2012-064801 A | 3/2012 |
| JP | 2012-156211 A | 8/2012 |
| JP | 2012-160642 A | 8/2012 |
| WO | 2011/155379 A1 | 12/2011 |
| WO | 2012/165045 | 12/2012 |

OTHER PUBLICATIONS

Supplementary European Search Report mailed Jul. 27, 2016, issued for European patent application No. 14743065.6.
Notice of Reasons for Rejection, issued in corresponding Japanese Patent Application No. JP 2013-216783, dated Jul. 11, 2017.

* cited by examiner

POWER MODULE SUBSTRATE, HEAT-SINK-ATTACHED POWER MODULE SUBSTRATE, AND HEAT-SINK-ATTACHED POWER MODULE

TECHNICAL FIELD

The present invention relates to a power module substrate including a circuit layer that is formed on one surface (first surface) of a ceramic substrate and a metal layer that is formed on the other surface (second surface) of the ceramic substrate, a heat-sink-attached power module substrate having a heat sink bonded to the power module substrate, and a heat-sink-attached power module having a semiconductor device bonded to the heat-sink-attached power module substrate.

Priority is claimed on Japanese Patent Application No. 2013-009199, filed Jan. 22, 2013, and Japanese Patent Application No. 2013-216783, filed Oct. 17, 2013, the contents of which are incorporated herein by reference.

BACKGROUND ART

Among various semiconductor devices, the amount of heat generated in a high power control power device used for controlling electric automobiles, electric vehicles and the like is large. Thus, a power module substrate obtained by bonding metal plates, respectively, as a circuit layer and a metal layer, to one surface (first surface) and the other surface (second surface) of a ceramic substrate composed of, for example, AlN (aluminum nitride) or the like as a substrate on which the power device is mounted has been widely used in the related art.

Such a power module substrate is used to form a heat-sink-attached power module substrate by bonding a heat sink having excellent thermal conductivity to the side of the second surface of the ceramic substrate. In addition, a semiconductor device, as a power device, is mounted on the circuit layer with a soldering material interposed therebetween to form a heat-sink-attached power module.

As the above-described power module substrate, for example, PTL 1 discloses a power module substrate including a metal layer having a 4N aluminum (4N—Al) layer bonded to a lower surface of a ceramic substrate and a 2N aluminum (2N—Al) layer bonded to the 4N aluminum layer. The metal layer of the power module substrate and a heat radiating plate (heat sink) composed of Cu are bonded to form a heat radiating plate-attached (heat-sink-attached) power module substrate.

In addition, PTL 2 discloses a power module substrate including a metal layer composed of a 2N aluminum layer that is bonded to a lower surface of a ceramic substrate.

PTL 3 discloses a power module substrate including a metal layer composed of a Cu layer that is bonded to a lower surface of a ceramic substrate.

CITATION LIST

Patent Literature

[PTL 1] Japanese Patent No. 4037425
[PTL 2] Japanese Patent No. 4629016
[PTL 3] Japanese Unexamined Patent Application, First Publication No. H4-162756

SUMMARY OF INVENTION

Technical Problem

However, in the power module substrates disclosed in PTLs 1 and 2, the metal layer is composed of Al as described above. Here, since Al has poor solderability, it is necessary to form Ni plating on the surface when the metal layer composed of Al and the heat radiating plate are bonded by soldering, which increases manufacturing costs. Further, the number of manufacturing processes of the power module is increased for performing the Ni plating and there is a problem that productivity deteriorates.

Further, since Al has a relatively low deformation resistance, cracks initiate in the solder due to thermal stress generated between the power module substrate and the heat radiating plate when a cooling and heating cycle is loaded on the power module and thus there is another problem that bonding reliability decreases or thermal resistance increases.

On the other hand, in a case in which the metal layer is composed of Cu as disclosed in PTL 3, since Cu has satisfactory solderability, it is not necessary to form the above-described Ni plating. In addition, since Cu has a relatively high deformation resistance, wrinkles can be prevented from occurring in the metal layer during loading of a cooling and heating cycle and cracks can be prevented from initiating in the solder for bonding the power module substrate and the heat radiating plate.

However, since Cu has a relatively high deformation resistance as described above, fracturing may occur in the ceramic substrate due to thermal stress generated between the ceramic substrate and the metal layer during loading of a cooling and heating cycle in some cases.

Particularly, in recent years, while the size and thickness of a power module have been reduced, the usage environment thereof has become more severe. Moreover, the amount of heat generated from a semiconductor device has increased and thus the conditions for a cooling and heating cycle have become restricted. Accordingly, a power module substrate having a higher reliability has been desired.

The present invention is made in consideration of the above-described circumstances and an object thereof is to provide a power module substrate capable of preventing cracks from initiating in solder for bonding a metal layer and a heat sink during loading of a cooling and heating cycle, preventing a decrease in bonding reliability and an increase in thermal resistance, and preventing fracturing from occurring in a ceramic substrate, a heat-sink-attached power module substrate, and a heat-sink-attached power module.

Solution to Problem

In order to solve the above-described problems, (1) according to an aspect of the present invention, a power module substrate is provided including a circuit layer that is formed on one surface (first surface) of a ceramic substrate and a metal layer that is formed on the other surface (second surface) of the ceramic substrate, in which the metal layer has a first aluminum layer that is bonded to the other surface of the ceramic substrate and a first copper layer that is bonded to the first aluminum layer by solid-phase diffusion bonding.

According to the power module substrate of the present invention, since the first aluminum layer is bonded to the second surface of the ceramic substrate and further the first copper layer is bonded to the first aluminum layer, when a heat sink is bonded to the power module substrate, the metal layer and the heat sink can be satisfactorily bonded by bonding the first copper layer and the heat sink without forming Ni plating on the metal layer. In addition, when the power module substrate and the heat sink are bonded by soldering, the first copper layer having a relatively high deformation resistance and the heat sink are bonded. Thus, cracks are prevented from initiating in the solder during loading of a cooling and heating cycle and a decrease in bonding reliability or an increase in thermal resistance can be prevented.

Further, since the first aluminum layer having a relatively low deformation resistance is bonded to the second surface of the ceramic substrate, even when a cooling and heating cycle is loaded, thermal stress generated between the ceramic substrate and the first copper layer is absorbed by the first aluminum layer, and fracturing can be prevented from occurring in the ceramic substrate.

Since the first aluminum layer and the first copper layer are bonded by solid-phase diffusion bonding, the bonding reliability between the first aluminum layer and the first copper layer can be improved. In addition, when a cooling and heating cycle is loaded, peeling-off occurring between the first aluminum layer and the first copper layer can be prevented and the thermal conductivity of the metal layer can be maintained.

(2) According to another aspect of the present invention, in the power module substrate according to (1), the circuit layer has a second aluminum layer that is bonded to one surface (first surface) of the ceramic substrate, and a second copper layer that is bonded to the second aluminum layer by solid-phase diffusion bonding.

In this configuration, in the case in which the circuit layer has the second copper layer and a semiconductor device is mounted on the second copper layer, when heat generated from the semiconductor device is transferred to the power module substrate, the heat spreads on the second copper layer of the circuit layer in the plane direction and thus effective heat radiation can be achieved.

Further, since in the case in which the second aluminum layer having a relatively low deformation resistance is formed on the first surface of the ceramic substrate, thermal stress caused by a difference in thermal expansion coefficient between the ceramic substrate and the circuit layer when a cooling and heating cycle is loaded is absorbed by the second aluminum layer, fracturing can be prevented from occurring in the ceramic substrate. In addition, since the second copper layer having a relatively high deformation resistance is formed on the one side of the second aluminum layer, the circuit layer can be prevented from being deformed when a power cycle is loaded.

In addition, since the second aluminum layer and the second copper layer are bonded by solid-phase diffusion bonding, peeling-off occurring between the second aluminum layer and the second copper layer is prevented when a cooling and heating cycle is loaded, and the thermal conductivity and electrical conductivity of the circuit layer can be maintained.

Here, one side of the second aluminum layer refers to a surface side which is not bonded to the ceramic substrate.

(3) According to another aspect of the present invention, there is provided a heat-sink-attached power module substrate including the power module substrate according to (1) or (2), and a heat sink, in which the first copper layer and the heat sink are bonded.

According to the heat-sink-attached power module substrate of the present invention, since the first copper layer of the power module substrate is bonded to the heat sink, the metal layer and the heat sink can be bonded by soldering without forming Ni plating on the metal layer. In addition, when the metal layer and the heat sink are bonded by soldering, the first copper layer having a relatively high deformation resistance and the heat sink are bonded. Thus, cracks are prevented from occurring in the solder when a cooling and heating cycle is loaded and a decrease in bonding reliability and an increase in thermal resistance can be prevented. Further, since the first aluminum layer having a relatively low deformation resistance is bonded to the second surface of the ceramic substrate, thermal stress when a cooling and heating cycle is loaded can be absorbed by the first aluminum layer and fracturing can be prevented from occurring in the ceramic substrate.

(4) According to another aspect of the present invention, in the heat-sink-attached power module substrate according to (3), the heat sink is composed of Cu or a Cu alloy and the power module substrate and the heat sink are bonded by soldering.

In this case, the first copper layer of the metal layer and the heat sink composed of Cu or a Cu alloy can be satisfactorily bonded by soldering. In addition, since the heat sink is composed of Cu or a Cu alloy having satisfactory thermal conductivity, heat generated from the power module substrate can be effectively radiated to the heat sink.

(5) According to another aspect of the present invention, in the heat-sink-attached power module substrate according to (3), the heat sink is composed of Al or an Al alloy with Ni plating formed thereon and the power module substrate and the heat sink are bonded by soldering.

When Ni plating is formed on the heat sink composed of Al or an Al alloy, the above-described power module substrate and the heat sink can be satisfactorily bonded by soldering.

(6) According to another aspect of the present invention, a heat-sink-attached power module includes the heat-sink-attached power module substrate according to any one of (3) to (5), and a semiconductor device that is bonded to one surface (first surface) of the circuit layer.

In this case, since the power module includes the above-described power module substrate, cracks are prevented from initiating in the solder for bonding the metal layer and the heat sink even when a cooling and heating cycle is loaded. Thus, a decrease in bonding reliability and an increase in thermal resistance can be prevented and fracturing can be prevented from occurring in the ceramic substrate.

Advantageous Effects of Invention

According to the present invention, it is possible to provide a power module substrate capable of preventing cracks from initiating in solder for bonding a metal layer and a heat sink when a cooling and heating cycle is loaded, preventing a decrease in bonding reliability and an increase in thermal resistance, and preventing fracturing from occurring in a ceramic substrate, a heat-sink-attached power module substrate, and a heat-sink-attached power module.

DESCRIPTION OF EMBODIMENTS

Hereinafter, embodiments of the present invention will be described with reference to the attached drawings.

Figure 1:
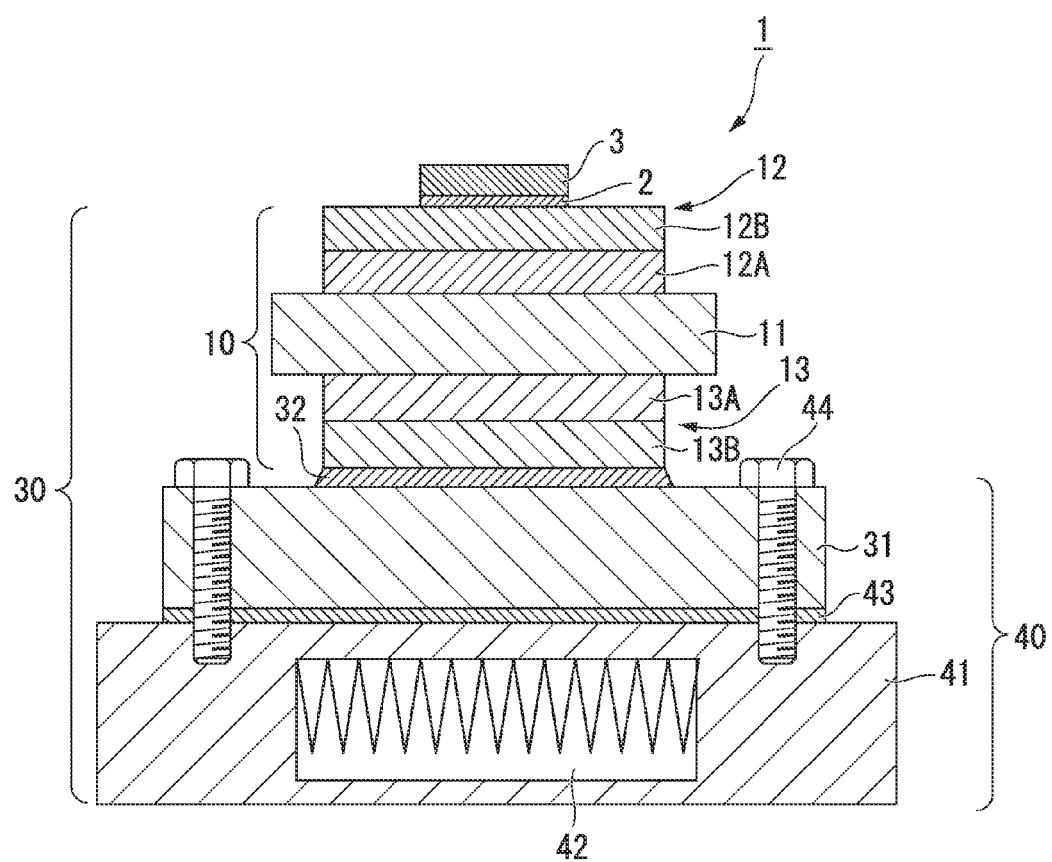
FIG. 1 is a schematic explanatory diagram showing a heat-sink-attached power module, a heat-sink-attached power module substrate, and a power module substrate according to an embodiment of the present invention.

In FIG. 1, a heat-sink-attached power module 1, a heat-sink-attached power module substrate 30 and a power module substrate 10 according to the embodiment of the present invention are shown.

The heat-sink-attached power module 1 includes the heat-sink-attached power module substrate 30 and a semiconductor device 3 that is bonded to one side (the upper side in FIG. 1) of the heat-sink-attached power module substrate 30 with a solder layer 2 interposed therebetween.

The solder layer 2 is composed of, for example, a Sn—Ag-based, Sn—Cu-based, Sn—In-based, or a Sn—Ag—Cu-based soldering material (so-called lead-free soldering material) and used for bonding the heat-sink-attached power module substrate 30 and the semiconductor device 3.

The semiconductor device 3 is an electric component provided with a semiconductor and various semiconductor devices are selected according to required functions. In the present embodiment, an IGBT device is used.

The heat-sink-attached power module substrate 30 is provided with the power module substrate 10 and a heat sink 40 that is bonded to the other side (the lower side in FIG. 1) of the power module substrate 10.

As shown in FIG. 1, the power module substrate 10 includes a ceramic substrate 11, a circuit layer 12 that is formed on one surface (which is the first surface and the upper surface in FIG. 1) of the ceramic substrate 11, and a metal layer 13 that is formed on the other surface (which is the second surface and the lower surface in FIG. 1) of the ceramic substrate 11.

The ceramic substrate 11 prevents electrical connection between the circuit layer 12 and the metal layer 13 and is composed of AlN (aluminum nitride) having a high degree of insulation. In addition, the thickness of the ceramic substrate 11 is 0.2 mm to 1.5 mm and is set to 0.635 mm in the present embodiment.

As shown in FIG. 1, the metal layer 13 has a first aluminum layer 13A that is bonded to the second surface of the ceramic substrate 11 and a first copper layer 13B that is laminated on the other side (the lower side in FIG. 1) of the first aluminum layer 13A.

The first aluminum layer 13A is formed by bonding an aluminum plate to the second surface of the ceramic substrate 11. In the present embodiment, the first aluminum layer 13A is formed by bonding an aluminum plate composed of a rolled plate of aluminum having a purity of 99.99% by mass or more (so-called 4N aluminum) to the ceramic substrate 11. Here, it is preferable that the thickness of the aluminum plate to be bonded is 0.2 mm to 3.0 mm.

The first copper layer 13B is formed by bonding a copper plate composed of a rolled plate of oxygen-free copper to the other side (the lower side in FIG. 1) of the first aluminum layer 13A. In the present embodiment, the first copper layer 13B is formed by bonding the copper plate to the first aluminum layer 13A by solid-phase diffusion bonding. Here, it is preferable that the thickness of the copper plate to be bonded is set to 0.1 mm to 4.0 mm.

Figure 2:
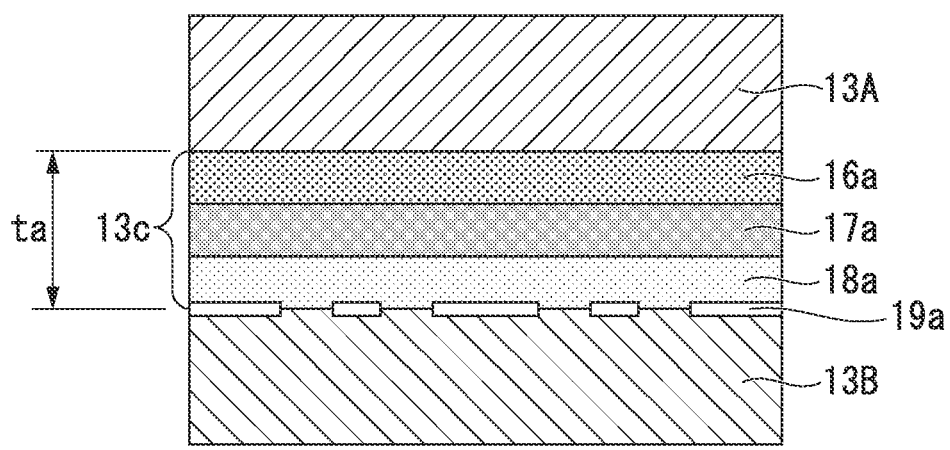
FIG. 2 is an enlarged explanatory diagram showing a bonding interface between a first aluminum layer and a first copper layer in a metal layer.

As shown in FIG. 2, at the interface between the first aluminum layer 13A and the first copper layer 13B, an intermetallic compound layer 13C is formed.

The intermetallic compound layer 13C is formed by mutual diffusion of Al atoms of the first aluminum layer 13A and Cu atoms of the first copper layer 13B. In the intermetallic compound layer 13C, a concentration gradient in which the concentration of Al atoms is gradually decreased and the concentration of Cu atoms is increased from the first aluminum layer 13A to the first copper layer 13B is formed.

The intermetallic compound layer 13C is composed of an intermetallic compound of Cu and Al and plural intermetallic compounds are laminated along the interface in the present embodiment. Here, the thickness to of the intermetallic compound layer 13C is 1 μm to 80 μm and preferably 5 μm to 80 μm.

In the present embodiment, as shown in FIG. 2, three kinds of intermetallic compounds are laminated and a θ phase 16a, a η2 phase 17a, and a ζ2 phase 18a are sequentially laminated from the first aluminum layer 13A to the first copper layer 13B.

In addition, at the bonding interface between the intermetallic compound layer 13C and the first copper layer 13B, oxides 19a are dispersed along the bonding interface in a layered state. In the present embodiment, the oxide 19a is an aluminum oxide such as alumina ($Al_2O_3$) or the like. The oxides 19a are dispersed on the interface in a state in which the oxides are dispersed on the interface between the intermetallic compound layer 13C and the first copper layer 13B in a divided state, and a region in which the intermetallic compound layer 13C and the first copper layer 13B come into direct contact with each other is also present.

Further, in the present embodiment, the average crystal grain size of the first copper layer 13B is 50 μm to 200 μm and the average crystal grain size of the first aluminum layer 13A is 500 μm or more.

As shown in FIG. 1, the circuit layer 12 has a second aluminum layer 12A that is bonded to the first surface of the ceramic substrate 11 and a second copper layer 12B that is laminated on one side (the upper side in FIG. 1) of the second aluminum layer 12A.

The second aluminum layer 12A is formed by bonding an aluminum plate to the first surface of the ceramic substrate 11. In the present embodiment, the second aluminum layer 12A is formed by bonding an aluminum plate composed of a rolled plate of aluminum having a purity of 99.99% by mass or more (so-called 4N aluminum) to the ceramic substrate 11.

Here, it is preferable that the thickness of the aluminum plate to be bonded is 0.2 mm to 3.0 mm.

The second copper layer 12B is formed by bonding a copper plate composed of a rolled plate of oxygen-free copper to one side (the upper side in FIG. 1) of the second aluminum layer 12A. In the present embodiment, the second copper layer 12B is formed by bonding the copper plate to the second aluminum layer 12A by solid-phase diffusion bonding. Here, it is preferable that the thickness of the copper plate to be bonded is 0.1 mm to 4.0 mm.

Figure 3:
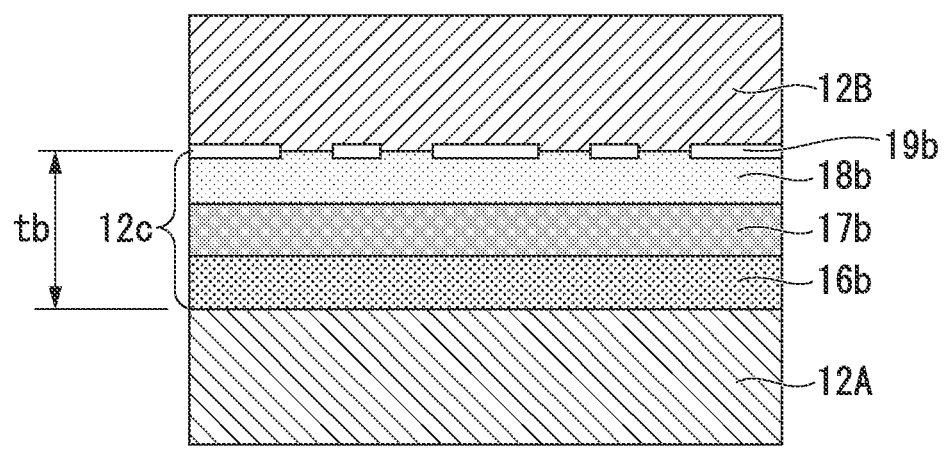
FIG. 3 is an enlarged explanatory diagram showing a bonding interface between a second aluminum layer and a second copper layer in a circuit layer.

As shown in FIG. 3, at the interface between the second aluminum layer 12A and the second copper layer 12B, an intermetallic compound layer 12C is formed.

The intermetallic compound layer 12C is formed by mutual diffusion of Al atoms of the second aluminum layer 12A and Cu atoms of the second copper layer 12B. In the intermetallic compound layer 12C, a concentration gradient in which the concentration of Al atoms is gradually decreased and the concentration of Cu atoms is increased from the second aluminum layer 12A to the second copper layer 12B is formed.

The intermetallic compound layer 12C is composed of an intermetallic compound of Cu and Al and plural intermetallic compounds are laminated along the interface in the present embodiment. Here, the thickness tb of the intermetallic compound layer 12C is 1 μm to 80 μm and preferably 5 μm to 80 μm.

Figure 12:
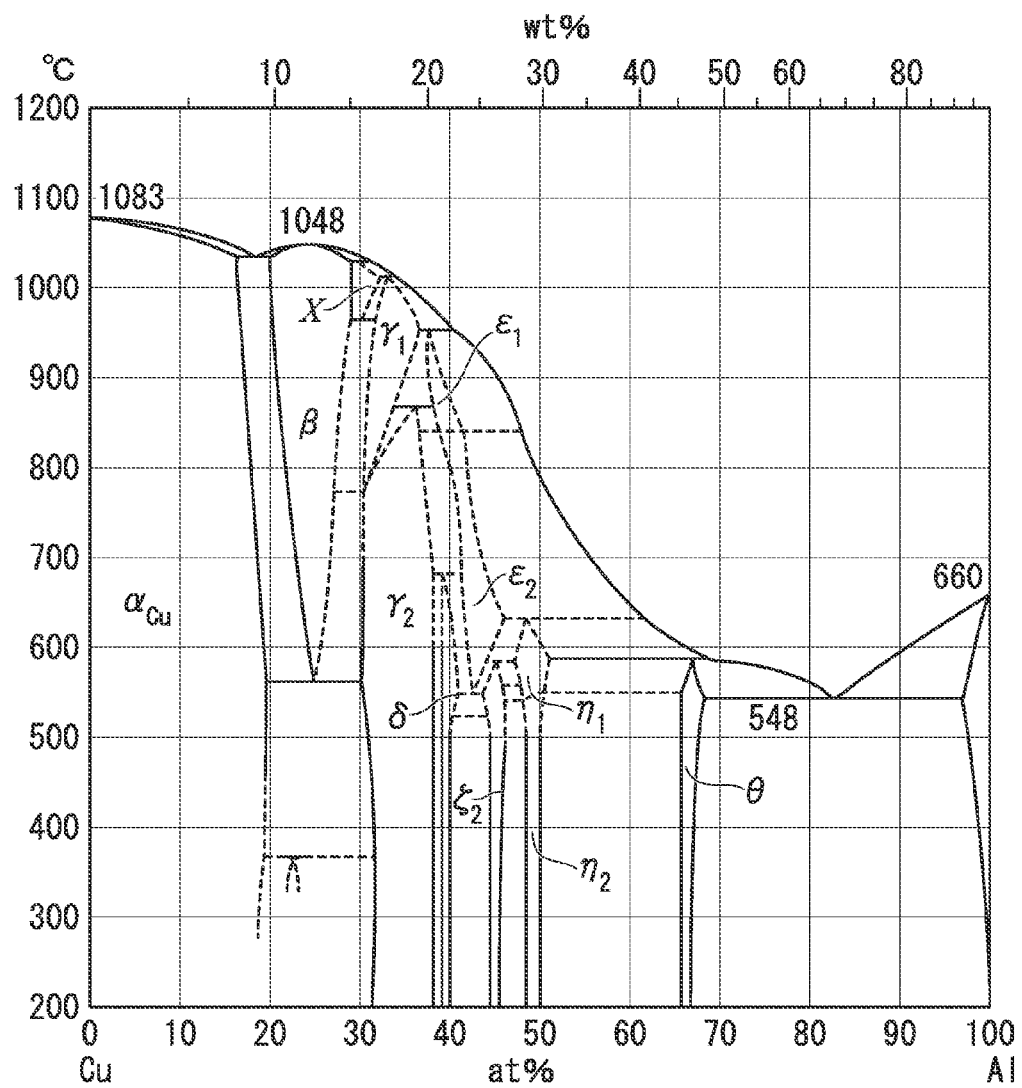
FIG. 12 is a binary phase diagram of Cu and Al.

In the present embodiment, as shown in FIG. 3, three kinds of intermetallic compounds are laminated and a θ phase 16b, a η2 phase 17b, and a ζ2 phase 18b are sequentially laminated from the second aluminum layer 12A to the second copper layer 12B (FIG. 12).

In addition, at the bonding interface between the intermetallic compound layer 12C and the second copper layer 12B, oxides 19b are dispersed along the bonding interface in a layered state. In the present embodiment, the oxide 19b is an aluminum oxide such as alumina ($Al_2O_3$) or the like. The oxides 19b are dispersed on the interface between the intermetallic compound layer 12C and the second copper layer 12B in a divided state, and a region in which the intermetallic compound layer 12C and the second copper layer 12B come into direct contact with each other is also present.

Further, in the present embodiment, the average crystal grain size of the second copper layer 12B is 50 μm to 200 μm and the average crystal grain size of the second aluminum layer 12A is 500 μm or more.

The heat sink 40 radiates heat from the power module substrate 10. In the present embodiment, the heat sink 40 is provided with a heat radiating plate 31 to which the power module substrate 10 is bonded and a cooling portion 41 provided with a flow passage 42 through which a cooling medium (for example, cooling water) flows. The heat radiating plate 31 and the cooling portion 41 are fixed by screws 44 with grease 43 interposed therebetween. The heat sink 40 is desirably composed of a material having satisfactory thermal conductivity and the heat radiating plate 31 is composed of oxygen-free copper and the cooling portion 41 is composed of an Al alloy in the present embodiment. The heat radiating plate 31 of the heat sink 40 and the first copper layer 13B are bonded by a solder layer 32 and for example, the solder layer 32 is formed of a Sn—Sb-based, Sn—Ag-based, Sn—Cu-based, Sn—In-based, or Sn—Ag—Cu-based soldering material (so-called lead-free soldering material).

Next, the method of manufacturing the heat-sink-attached power module 1, the heat-sink-attached power module substrate 30, and the power module substrate 10 according to the present embodiment will be described using FIGS. 4 to 6.

Figure 4:
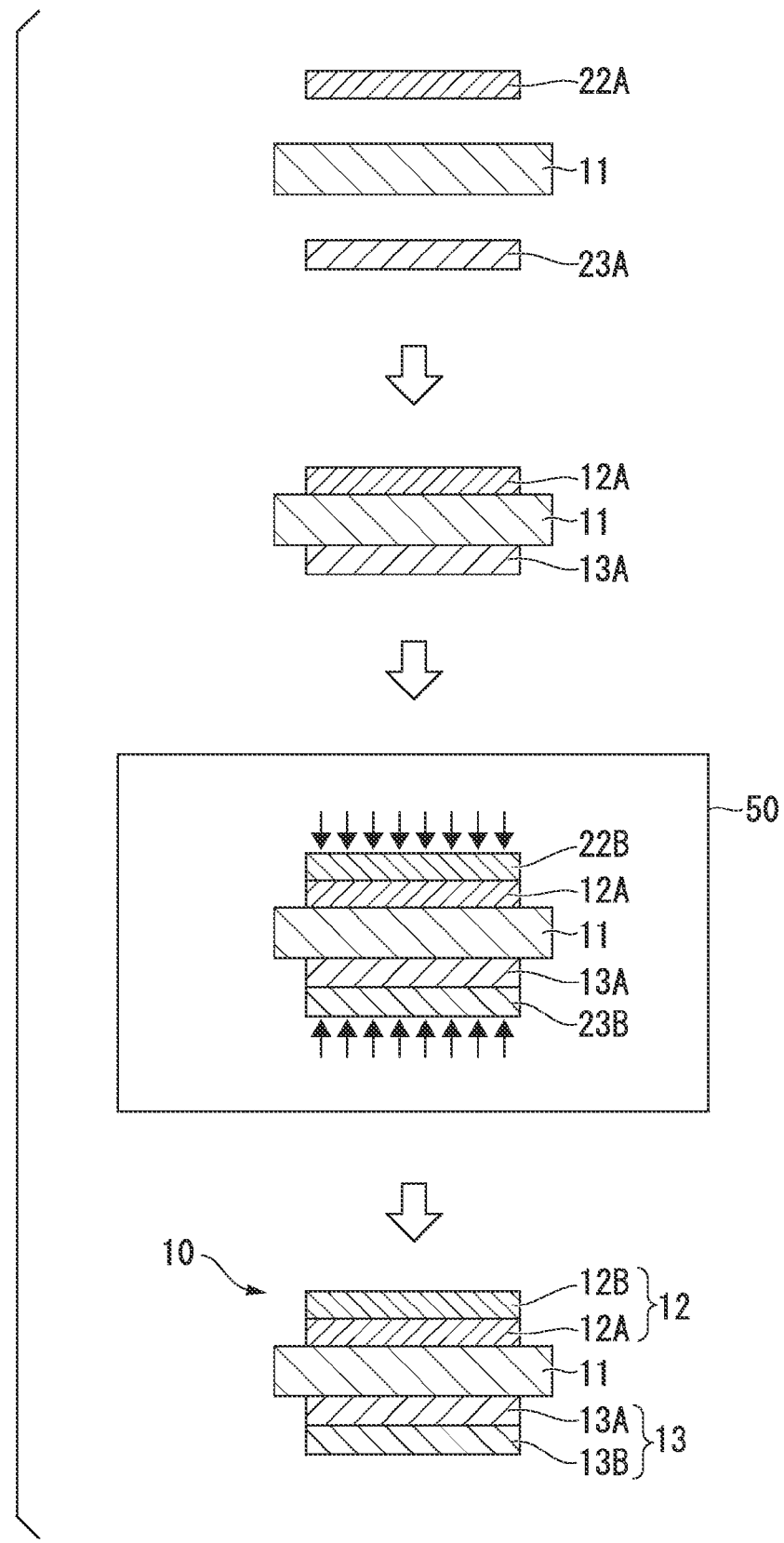
FIG. 4 is a schematic explanatory diagram showing a method of manufacturing a power module substrate according to the embodiment of the present invention.

First, as shown in FIG. 4, an aluminum plate 22A and an aluminum plate 23A are laminated on the first surfaces and second surface of the ceramic substrate 11 with an Al—Si-based brazing material (not shown) interposed therebetween. The ceramic substrate 11, the aluminum plate 22A, and the aluminum plate 23A are bonded by being pressurized, heated, and then cooled to form the second aluminum layer 12A and the first aluminum layer 13A on the ceramic substrate 11 (aluminum layer forming process S11). The brazing temperature is set to 640° C. to 650° C.

Next, a copper plate 22B is arranged on one side (upper side) of the second aluminum layer 12A and a copper plate 23B is arranged on the other side (lower side) of the first aluminum layer 13A. Then, the copper plates and the aluminum layers are put into a vacuum heating furnace 50 and a load is applied to one side (upper side) of the copper plate 22B and the other side (lower side) of the copper plate 23B. The inside of the vacuum heating furnace 50 is caused to be in a vacuum state and heating is performed. In the present embodiment, the load to be applied to each contact surface between the second aluminum layer 12A and the copper plate 22B, and the first aluminum layer 13A and the copper plate 23B is 3 kgf/cm² to 35 kgf/cm². The heating temperature in the vacuum heating furnace is 400° C. or higher and lower than 548° C. and the temperature is maintained for 5 to 240 minutes to perform solid-phase diffusion bonding. Thus, while the first copper layer 13B is formed by bonding the copper plate 23B to the first aluminum layer 13A, the second copper layer 12B is formed by bonding the copper plate 22B to the second aluminum layer 12A (copper layer forming process S12). In the present embodiment, the bonding surface between the second aluminum layer 12A and the copper plate 22B and the bonding surface between the first aluminum layer 13A and the copper plate 23B are subjected to solid-phase diffusion bonding after flaws of the corresponding surfaces are removed by smoothing the surfaces in advance.

The heating temperature in the vacuum heating is preferably 5° C. lower than the eutectic temperature of Al and Cu up to a temperature lower than the eutectic temperature.

As described above, the circuit layer 12 and the metal layer 13 are formed to obtain the power module substrate 10 according to the present embodiment.

Figure 5:
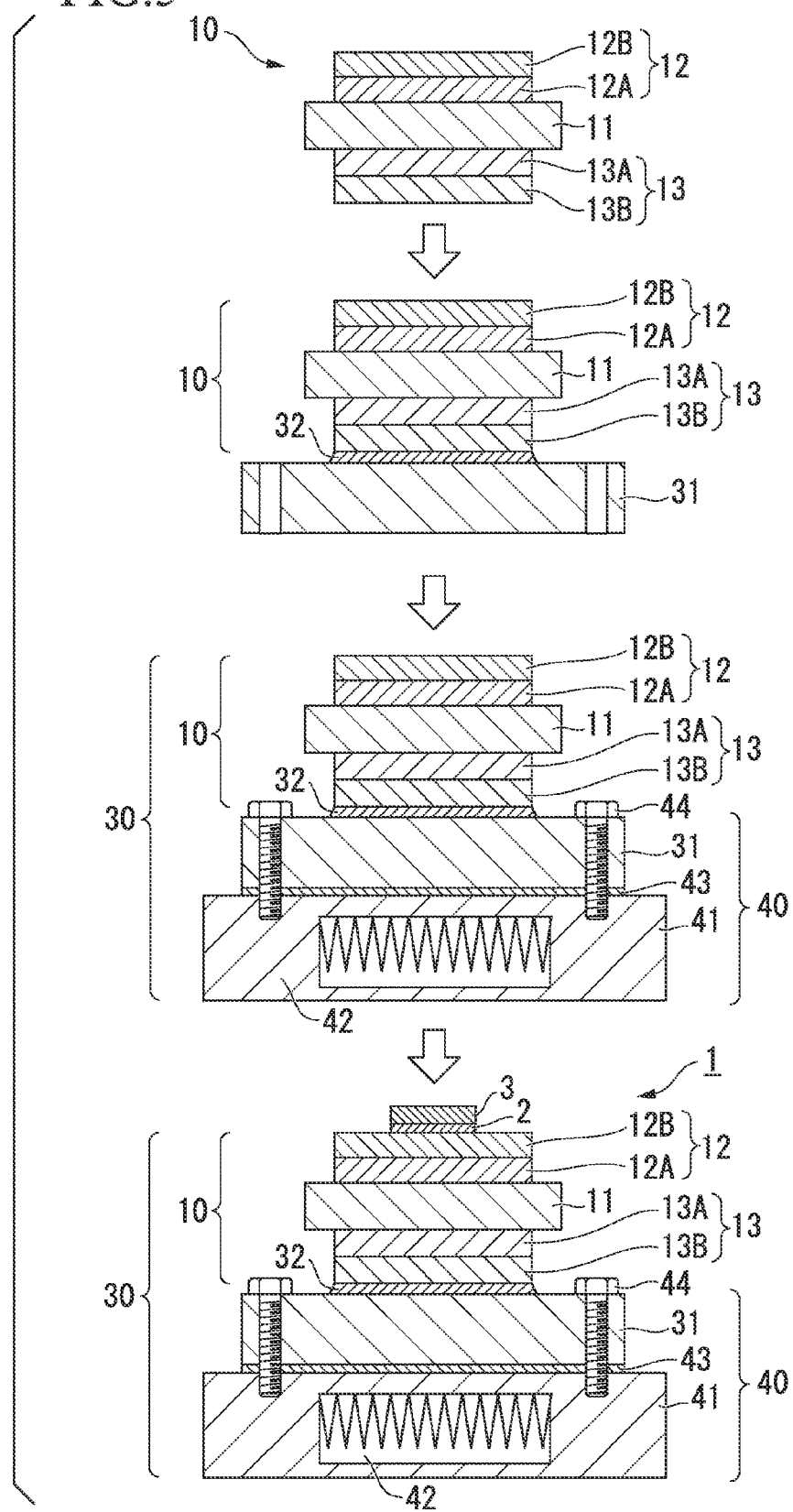
FIG. 5 is a schematic explanatory diagram showing a method of manufacturing a power module according to the embodiment of the present invention.
Figure 6:
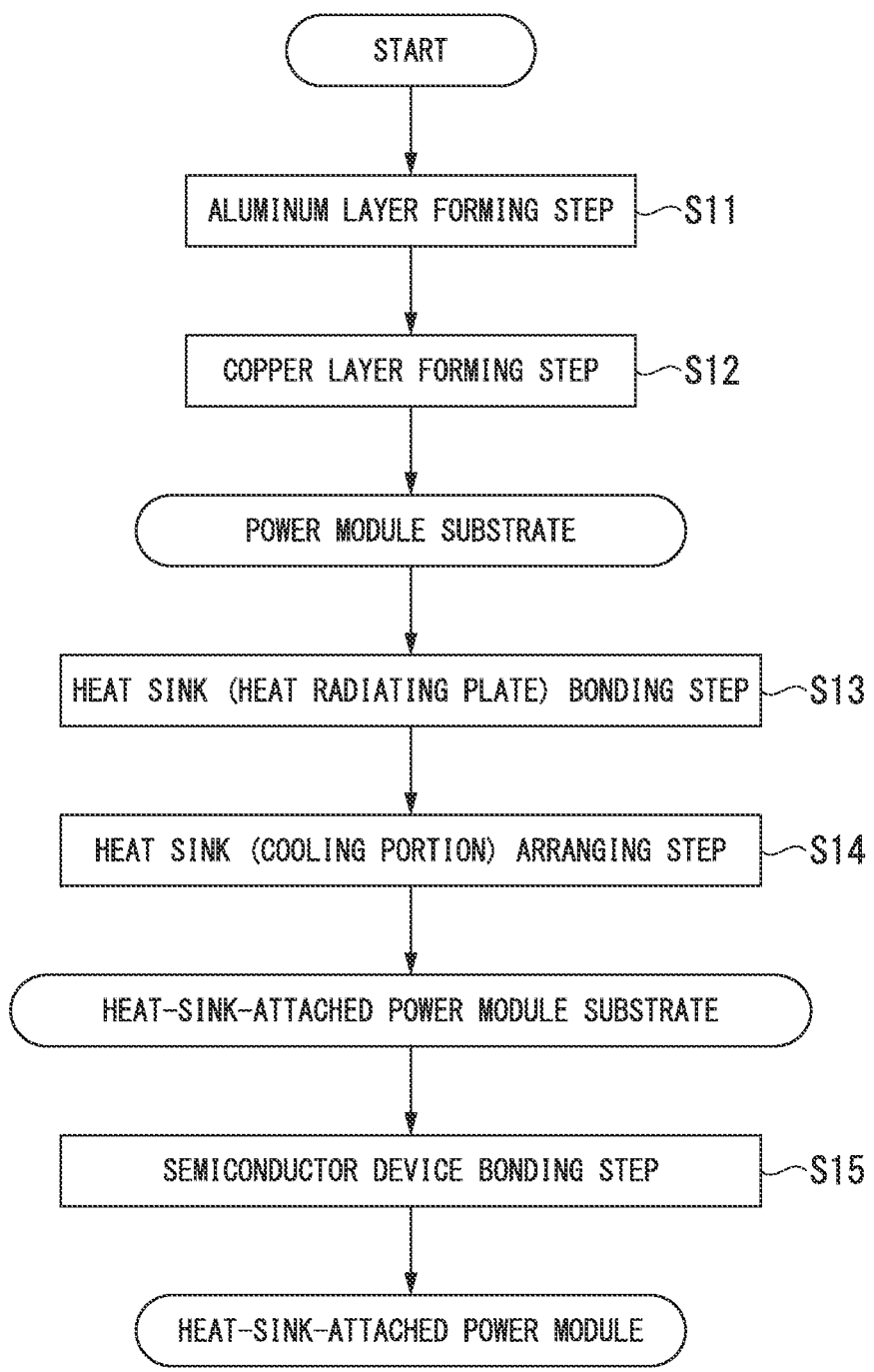
FIG. 6 is a flow diagram showing a method of manufacturing a power module according to the embodiment of the present invention.

Next, as shown in FIG. 5, the heat sink 40 (heat radiating plate 31) is bonded to the other side (lower side in FIG. 5) of the power module substrate 10 by soldering (heat sink (heat radiating plate) bonding process S13).

Next, the heat sink 40 (cooling portion 41) is arranged on the other side (lower side in FIG. 5) of the heat sink 40 (heat radiating plate 31) with the grease 43 interposed therebetween (heat sink (cooling portion) arranging process S14). In the present embodiment, the heat radiating plate 31 and the cooling portion 41 are bonded by the screws 44. In this manner, the heat-sink-attached power module substrate 30 is obtained.

Finally, the semiconductor device 3 is bonded to one surface (upper surface in FIG. 5) of the circuit layer 12 of the heat-sink-attached power module substrate 30 by soldering (semiconductor device bonding process S15).

As described above, the heat-sink-attached power module 1 according to the present embodiment is obtained.

In the thus-configured heat-sink-attached power module 1, heat-sink-attached power module substrate 30 and power module substrate 10 according to the present embodiment, the first aluminum layer 13A is bonded to the second surface (lower surface) of the ceramic substrate 11, the first copper layer 13B is bonded to the first aluminum layer 13A, and further the first copper layer 13B and the heat sink 40 are bonded. Thus, the metal layer 13 and the heat sink 40 can be satisfactorily bonded without forming Ni plating on the metal layer 13. In addition, since the first copper layer 13B having a relatively high deformation resistance and the heat radiating plate 31 are bonded, cracks are prevented from initiating in the solder layer 32 during loading of a cooling and heating cycle and a decrease in bonding reliability and an increase in thermal resistance can be suppressed.

Further, when a cooling and heating cycle is loaded, thermal stress is generated between the ceramic substrate 11 and the metal layer 13. However, the first aluminum layer 13A having a relatively low deformation resistance is bonded to the second surface of the ceramic substrate 11 and thus the thermal stress can be absorbed by the first aluminum layer 13A and fracturing can be prevented from occurring in the ceramic substrate 11.

Since the first aluminum layer 13A and the first copper layer 13B of the metal layer 13 are bonded by solid-phase diffusion bonding, the bonding reliability between the first aluminum layer 13A and the first copper layer 13B can be improved. When a cooling and heating cycle is loaded, peeling-off occurring between the first aluminum layer 13A and the first copper layer 13B can be prevented and the thermal conductivity of the metal layer 13 can be maintained.

Further, the circuit layer 12 has the second copper layer 12B and the semiconductor device 3 is mounted on the second copper layer 12B. Thus, when heat generated from the semiconductor device 3 is transferred to the power module substrate 10, the heat spreads on the second copper layer 12B in the plane direction and effective heat radiation can be achieved.

Since the second aluminum layer 12A having a relatively low deformation resistance is formed on the first surface (upper surface) of the ceramic substrate 11, thermal stress caused by a difference in thermal expansion coefficient between the ceramic substrate 11 and the circuit layer 12 when a cooling and heating cycle is loaded can be absorbed by the second aluminum layer 12A and fracturing can be prevented from occurring in the ceramic substrate 11.

Since the second copper layer 12B having a relatively high deformation resistance is formed on one side of the second aluminum layer 12A, the circuit layer 12 can be prevented from being deformed when a power cycle is loaded and cracks can be prevented from initiating in the solder for bonding the circuit layer 12 and the semiconductor device 3.

In addition, since the second aluminum layer 12A and the second copper layer 12B are bonded by solid-phase diffusion bonding, the bonding reliability between the second aluminum layer 12A and the second copper layer 12B can be improved and peeling-off occurring between the second aluminum layer 12A and the second copper layer 12B can be prevented when a cooling and heating cycle is loaded. Thus, the thermal conductivity and the electrical conductivity of the circuit layer 12 can be maintained.

In the present embodiment, the intermetallic compound layers 13C and 12C composed of an intermetallic compound of Cu and Al are respectively formed between the first aluminum layer 13A and the first copper layer 13B and between the second aluminum layer 12A and the second copper layer 12B. Accordingly, Al in the first aluminum layer 13A and the second aluminum layer 12A sufficiently diffuses to the first copper layer 13B and the second copper layer 12B, Cu in the first copper layer 13B and the second copper layer 12B sufficiently diffuses to the first aluminum layer 13A and the second aluminum layer 12A, and mutual diffusion of Al and Cu is sufficiently performed. The first aluminum layer 13A and the first copper layer 13B are reliably bonded by solid-phase diffusion bonding, and the second aluminum layer 12A and the second copper layer 12B are reliably bonded by solid-phase diffusion bonding. Thus, sufficient bonding strength can be ensured.

Further, since the oxides 19$a$ and 19$b$ are respectively dispersed along the bonding interfaces in a layered state at the bonding interfaces between the first copper layer 13B and the intermetallic compound layer 13C and between the second copper layer 12B and the intermetallic compound layer 12C, respective oxide films formed on the first aluminum layer 13A and the second aluminum layer 12A are reliably broken, thereby mutual diffusion of Cu and Al sufficiently proceeds actually, and thus the first aluminum layer 13A and the first copper layer 13B are reliably bonded and the second aluminum layer 12A and the second copper layer 12B are reliably bonded.

In the present embodiment, since the intermetallic compound layers 12C and 13C have a structure in which plural intermetallic compounds are laminated along the bonding interfaces, brittle intermetallic compounds can be prevented from growing to a large size.

In addition, since the intermetallic compounds suitable for each composition are formed in a layered state from the first copper layer 13B to the first aluminum layer 13A and from the second copper layer 12B to the second aluminum layer 12A due to mutual diffusion of each of Cu in the first copper layer 13B and in the second copper layer 12B and Al in the first aluminum layer 13A and in the second aluminum layer 12A, the properties of the bonding interface can be stabilized.

Specifically, since the intermetallic compound layer 13C is configured by sequentially laminating three kinds of the intermetallic compounds of the $\theta$ phase 16$a$, the $\eta2$ phase 17$a$, and the $\zeta2$ phase 18$a$ from the first aluminum layer 13A to the first copper layer 13B and since the intermetallic compound layer 12C is configured by sequentially laminating three kinds of the intermetallic compounds of the $\theta$ phase 16$b$, the $\eta2$ phase 17$b$, and the $\zeta2$ phase 18$b$ from the second aluminum layer 12A to the second copper layer 12B, the volume change inside the intermetallic compound layers 13C and 12C is reduced and an internal strain can be suppressed.

That is, when solid-phase diffusion is not used, for example, when a liquid phase is formed, intermetallic compounds are excessively produced and a volume change in the intermetallic compound layer is increased and thus an internal strain is generated in the intermetallic compound layer. However, when solid-phase diffusion is used, the brittle intermetallic compound layer does not grow to a large size and the intermetallic compounds are formed in a layered state and thus the internal strain is suppressed.

Further, in the present embodiment, the average crystal grain size of both the first aluminum layer 13A and the second aluminum layer 12A is set to 500 µm or more, the average crystal grain size of both the first copper layer 13B and the second copper layer 12B is 50 µm to 200 µm, and thus the average crystal grain size of both the first aluminum layer 13A and the first copper layer 13B and the average crystal grain sizes of both the second aluminum layer 12A and the second copper layer 12B are set to be relatively large. Accordingly, an excessive strain is not accumulated in the first aluminum layer 13A and the first copper layer 13B and in the second aluminum layer 12A and the second copper layer 12B, and fatigue properties are improved. Thus, the reliability of thermal stress generated in the power module substrate 10 during loading of a cooling and heating cycle is improved.

Further, in the present embodiment, since both the thickness to of the intermetallic compound layer 13C and the thickness tb of the intermetallic compound layer 12C are 1 µm to 80 µm, preferably 5 µm to 80 µm, mutual diffusion of Cu and Al sufficiently proceeds, and the first aluminum layer 13A and the first copper layer 13B can be strongly bonded and the second aluminum layer 12A and the second copper layer 12B can be strongly bonded. Also, brittle intermetallic compounds can be prevented from growing excessively and the properties of the bonding interface can be stabilized.

Here, the preferable thickness of both the aluminum plate 22A and the aluminum plate 23A is 0.2 mm to 3.0 mm. When the thickness of both the aluminum plate 22A and the aluminum plate 23A is set to 0.2 mm or more, thermal stress generated in the ceramic substrate 11 in a cooling and heating cycle can be reduced and cracks can be prevented from initiating in the ceramic substrate 11. In addition, when the thickness of both the aluminum plate 22A and the aluminum plate 23A is set to 3.0 mm or less, the initial thermal resistance in a power cycle can be reduced.

Further, the thickness of the copper plate 22B is preferably set to 0.1 mm to 4.0 mm. When the thickness of the copper plate 22B is set to 0.1 mm or more, heat from the semiconductor device 3 spreads on the second copper layer 12B and more effective heat radiation can be achieved and the initial thermal stress during loading of a power cycle can be reduced. Thus, the reliability of a power cycle can be further improved. In addition, when the thickness of the copper plate 22B is set to 4.0 mm or less, the rigidity of the circuit layer 12 is reduced and fracturing can be prevented from occurring in the ceramic substrate 11 during loading of a cooling and heating cycle.

Further, the thickness of the copper plate 23B is preferably set to 0.1 mm to 4.0 mm. When the thickness of the copper plate 23B is set to 0.1 mm or more, the rigidity of the copper plate 23B is sufficient and the solder layer 32 can be prevented from being deformed in a cooling and heating cycle. In addition, when the thickness of the copper plate 23B is set to 4.0 mm or less, the rigidity of the metal layer 13 is reduced and fracturing can be prevented from occurring in the ceramic substrate 11 during loading of a cooling and heating cycle.

In the heat-sink-attached power module 1 using the above-described power module substrate 10 and heat-sink-attached power module substrate 30, heat generated from the semiconductor device 3 can be effectively radiated. The temperature rise of the semiconductor device 3 is prevented and the semiconductor device 3 can be operated at a predetermined temperature. Thus, operation stability can be improved.

In the present embodiment, since the first aluminum layer 13A and the first copper layer 13B are bonded by solid-phase diffusion bonding and since the second aluminum layer 12A and the second copper layer 12B are bonded by solid-phase diffusion bonding, the power module substrate 10 including the circuit layer 12 that is formed on the first surface of the ceramic substrate 11 and has the second aluminum layer 12A and the second copper layer 12B and the metal layer 13 that is formed on the second surface of the ceramic substrate 11 and has the first aluminum layer 13A and the first copper layer 13B can be obtained.

In addition, the solid-phase diffusion bonding is performed in such a manner that the second aluminum layer 12A and the first aluminum layer 13A are respectively formed on the first surface and the second surface of the ceramic substrate 11, the copper plate 22B is arranged on one side of the second aluminum layer 12A, the copper plate 23B is arranged on the other side of the first aluminum layer 13A, and then the laminated body is retained at a temperature of 400° C. or higher and lower than 548° C. in a state in which a load of 3 kgf/cm$^2$ to 35 kgf/cm$^2$ is applied to the second aluminum layer 12A and the copper plate 22B and to the first aluminum layer 13A and the copper plate 23B. In this manner, the second aluminum layer 12A and the copper plate 22B are bonded and the first aluminum layer 13A and the copper plate 23B are bonded by solid-phase diffusion bonding by allowing Al atoms and Cu atoms to mutually disperse in a state in which the second aluminum layer 12A and the copper plate 22B come into sufficiently close contact with each other and the first aluminum layer 13A and the copper plate 23B come into sufficiently close contact with each other, and the second copper layer 12B can be formed on one side of the second aluminum layer 12A and the first copper layer 13B can be formed on the other side of the first aluminum layer 13A.

When a load of 3 kgf/cm$^2$ or more is applied to the first aluminum layer 13A and the first copper layer 13B and to the second aluminum layer 12A and the second copper layer 12B during the solid-phase diffusion bonding, satisfactory solid-phase diffusion bonding can be achieved and gaps between the first aluminum layer 13A and the first copper layer 13B and between the second aluminum layer 12A and the second copper layer 12B can be prevented from being formed. In addition, when the load is 35 kgf/cm$^2$ or less, fracturing can be prevented from occurring in the ceramic substrate 11. Accordingly, the load applied during the solid-phase diffusion bonding is within the above range.

When the temperature during the solid-phase diffusion bonding is 400° C. or higher, diffusion of Al atoms and Cu atoms is accelerated and solid-phase diffusion can be sufficiently achieved in a short period of time. In addition, when the temperature is lower than 548° C., a liquid phase is formed between Al and Cu and an uneven bonding interface or a change in thickness can be prevented. Therefore, the temperature in the solid-phase diffusion bonding is preferably 400° C. or higher and lower than 548° C.

In addition, the heating temperature during the solid-phase diffusion bonding is more desirably 5° C. lower than the eutectic temperature of Al and Cu up to a temperature lower than the eutectic temperature (not including the eutectic temperature). When such a temperature range is selected, a liquid phase is not formed and a compound of Al and Cu is not formed. Thus, the bonding reliability of the solid-phase diffusion bonding becomes satisfactory and also the diffusion rate during the solid-phase diffusion bonding is increased and the solid-phase diffusion bonding can be achieved in a relatively short period of time.

Further, during the solid-phase diffusion bonding, when there are flaws on the bonding surfaces, gaps are formed during the solid-phase diffusion bonding in some cases. However, the bonding surface between the first aluminum layer 13A and the copper plate 23B and the bonding surface between the second aluminum layer 12A and the copper plate 22B are subjected to solid-phase diffusion bonding after flaws of the corresponding surfaces are removed by smoothing the surfaces in advance. Thus, the first aluminum layer and the copper plate can be bonded and the second aluminum layer and the copper plate can be bonded while preventing gaps between each bonding interface from being formed.

The embodiment of the present invention has been described above. However, the present invention is not limited thereto and may be appropriately modified within a range not departing from the technical idea of the present invention.

In the above-described embodiment, the case in which the heat sink (heat radiating plate) is composed of a copper plate of oxygen-free copper has been described. However, the heat sink may be composed of pure copper such as tough pitch copper or a copper alloy. In addition, the heat sink (heat radiating plate) may be composed of Al or an Al alloy. In this case, the heat sink (heat radiating plate) is subjected to Ni plating and then the heat sink (heat radiating plate) and the power module substrate are bonded by soldering to achieve satisfactory solder bonding.

In the above-described embodiment, the case in which the first aluminum layer 13A and the copper plate 23B are bonded by solid-phase diffusion bonding and the second aluminum layer 12A and the copper plate 22B are bonded by solid-phase diffusion bonding at the same time has been described. However, the bonding between the first aluminum layer and the copper plate by solid-phase diffusion bonding and the bonding between the second aluminum layer and the copper plate by solid-phase diffusion bonding may be performed separately.

Further, the case in which the heat radiating plate and the cooling portion of the heat sink are fixed to each other by screws has been described. However, the method of bonding the heat radiating plate and the cooling portion is not limited and the heat radiating plate and the cooling portion may be bonded by, for example, solid-phase diffusion bonding.

In addition, in the above-described embodiment, the case in which the first aluminum layer and the second aluminum layer are composed of a rolled plate of pure aluminum having a purity of 99.99% has been described. However, the aluminum layers are not limited thereto and the aluminum layers may be composed of aluminum (2N aluminum) having a purity of 99%, an aluminum alloy or the like.

In the present embodiment, the case in which the heat sink 40 includes the heat radiating plate 31 and the cooling portion 41 and the power module substrate 10 and the heat radiating plate 31 are bonded has been described. However, the power module substrate 10 and the cooling portion 41 may be bonded without using the heat radiating plate 31. Further, the heat sink can have various configurations for radiating heat from a heat pipe or the like.

Further, the case in which a ceramic substrate composed of AlN is used as the ceramic substrate has been described. However, the ceramic substrate is not limited thereto and a ceramic substrate composed of $Si_3N_4$ or $Al_2O_3$ may be used.

In addition, in the above-described embodiment, the case in which the circuit layer has the second aluminum layer and the second copper layer has been described. However, the circuit layer is not limited thereto, and, for example, the circuit layer may be configured to have only the second aluminum layer or configured to have only the second copper layer.

In the power module substrate of the above-described embodiment, the case in which the circuit layer 12 includes the second aluminum layer 12A that is formed on the first surface of the ceramic substrate 11 and the second copper layer 12B that is formed by bonding the copper plate 22B to one side of the second aluminum layer 12A has been described. However, the circuit layer is not limited thereto.

Figure 7:
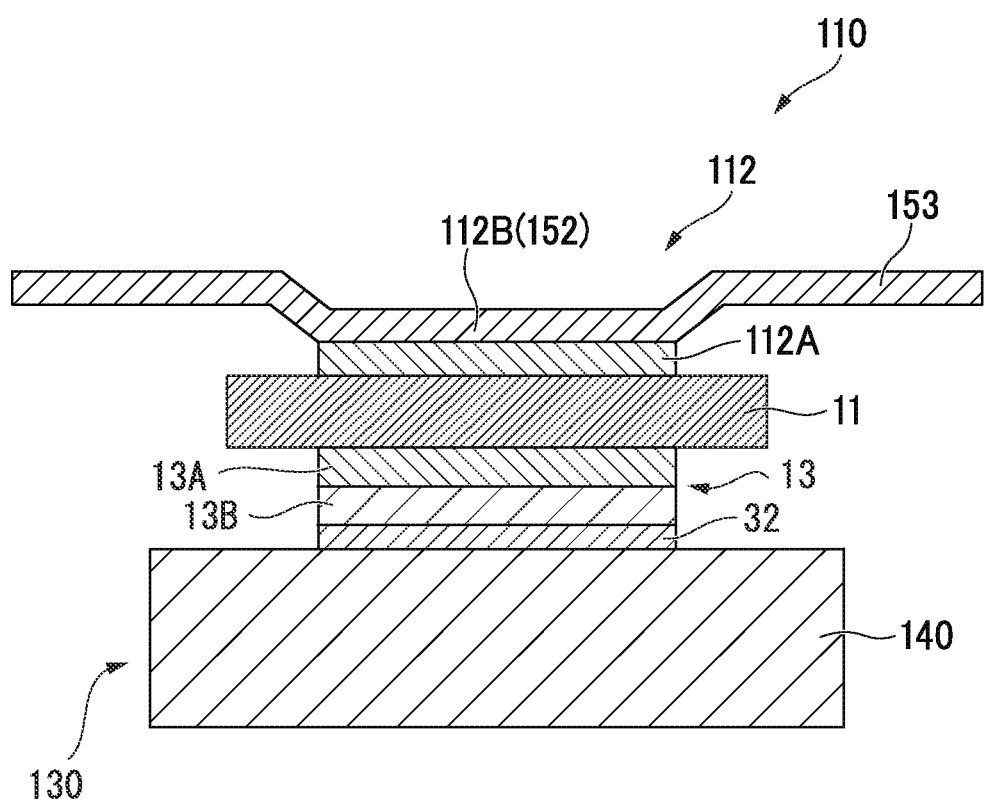
FIG. 7 is a schematic explanatory diagram showing a heat-sink-attached power module substrate and a power module substrate according to another embodiment of the present invention.

For example, as shown in a power module substrate 110 in FIG. 7, a circuit layer 112 may include a second aluminum layer 112A that is formed on the first surface of the ceramic substrate 11 and a second copper layer 112B that is bonded to one side of the second aluminum layer 112A, and the second copper layer 112B may be composed of a copper plate including a die pad 152 to which a semiconductor device or the like is bonded and a lead portion 153 that is used as an external terminal. In the power module substrate 110, the die pad 152 and the second aluminum layer 112A are bonded by solid-phase diffusion bonding.

Here, the thickness of the second aluminum layer 112A is preferably set to 0.1 mm to 1.0 mm. In addition, the thickness of the second copper layer 112B is preferably set to 0.1 mm to 6.0 mm.

Further, in a heat-sink-attached power module 130 shown in FIG. 7, a heat sink 140 is bonded to the metal layer 13 of the power module substrate 110 with the solder layer 32 interposed therebetween.

In the above-described embodiment, the case in which the intermetallic compound layer 13C is formed at the bonding interface between the aluminum layer and copper layer (between the first aluminum layer 13A and first copper layer 13B) and the intermetallic compound layer 12C is formed at the bonding interface between the aluminum layer and copper layer (between the second aluminum layer 12A and second copper layer 12B), and also the intermetallic compound layer 13C is configured by sequentially laminating the θ phase 16a, the $η_2$ phase 17a, and the $ζ_2$ phase 18a from the aluminum layer (first aluminum layer 13A) to the copper layer (first copper layer 13B) and the intermetallic compound layer 12C is configured by sequentially laminating the θ phase 16b, the $η_2$ phase 17b, and the $ζ_2$ phase 18b from the aluminum layer (second aluminum layer 12A) to the copper layer (second copper layer 12B) has been described. However, there is no limitation thereto.

Specifically, plural intermetallic compounds composed of Cu and Al may be sequentially laminated at the bonding interface between each aluminum layer and the copper layer (between the first aluminum layer and the first copper layer, and between the second aluminum layer and the second copper layer) such that the ratio of aluminum is decreased from the aluminum layer (first aluminum layer and second aluminum layer) to the copper layer (first copper layer and second copper layer).

Figure 8:
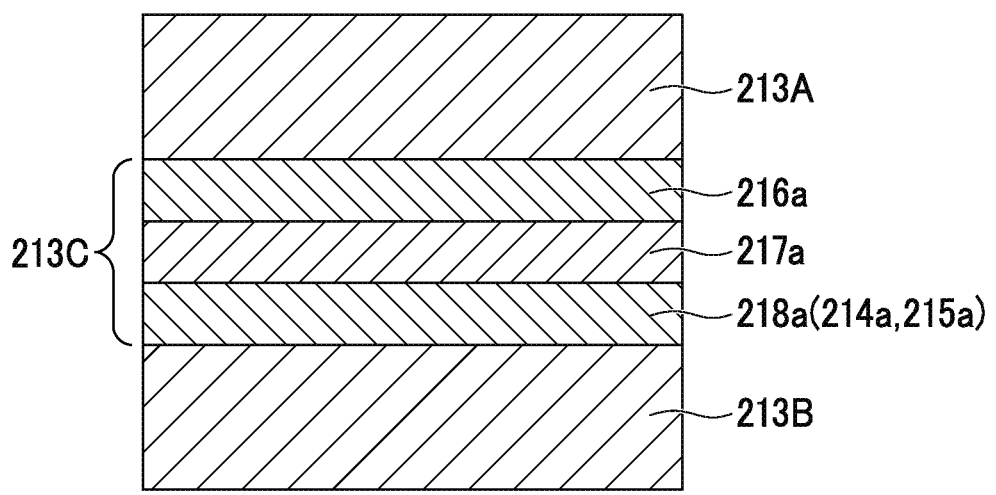
FIG. 8 is a schematic explanatory diagram showing a bonding interface between a first aluminum layer and a first copper layer in the heat-sink-attached power module substrate according to another embodiment of the present invention.
Figure 9:
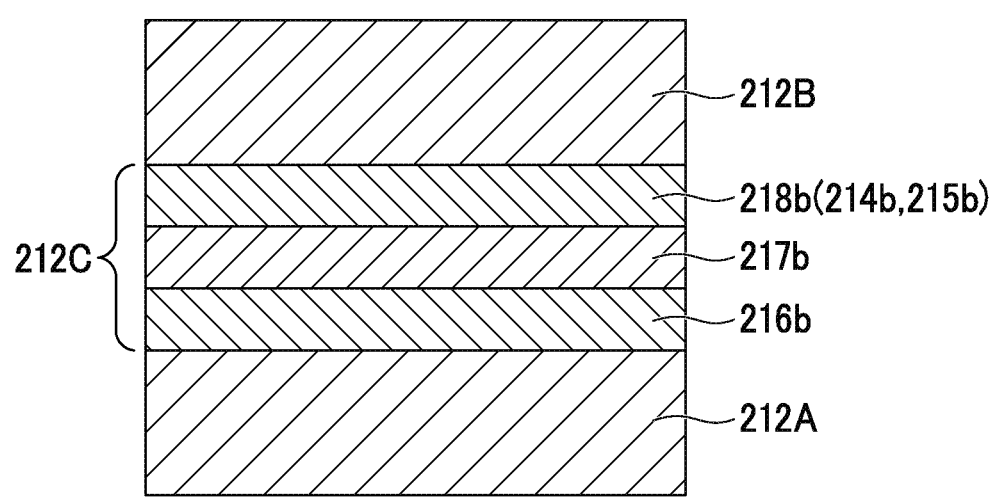
FIG. 9 is a schematic explanatory diagram showing a bonding interface between a second aluminum layer and a second copper layer in the heat-sink-attached power module substrate according to another embodiment of the present invention.

As shown in FIGS. 8 and 9, at the bonding interface between aluminum layer and copper layer (between first aluminum layer 213A and first copper layer 213B), a θ phase 216a, and a $η_2$ phase 217a may be sequentially laminated from the aluminum layer (first aluminum layer 213A) to the copper layer (first copper layer 213B) along the above-described interface and at least one of a $ζ_2$ phase 218a, a δ phase 214a, and a $γ_2$ phase 215a may be further laminated, and at the bonding interface between aluminum layer and copper layer (between second aluminum layer 212A and second copper layer 212B), a θ phase 216b, and a $\eta_2$ phase 217b may be sequentially laminated from the aluminum layer (second aluminum layer 212A) to the copper layer (second copper layer 212B) along the above-described interface and at least one of a $\zeta_2$ phase 218b, a δ phase 214b, and a $\gamma_2$ phase 215b may be further laminated (FIG. 12).

Figure 10:
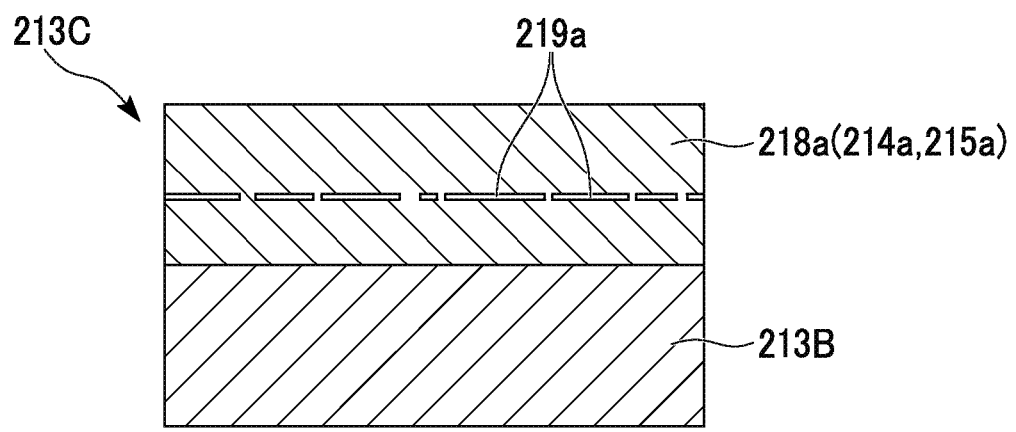
FIG. 10 is an enlarged explanatory diagram showing an interface between an intermetallic compound layer in FIG. 8 and the first copper layer.
Figure 11:
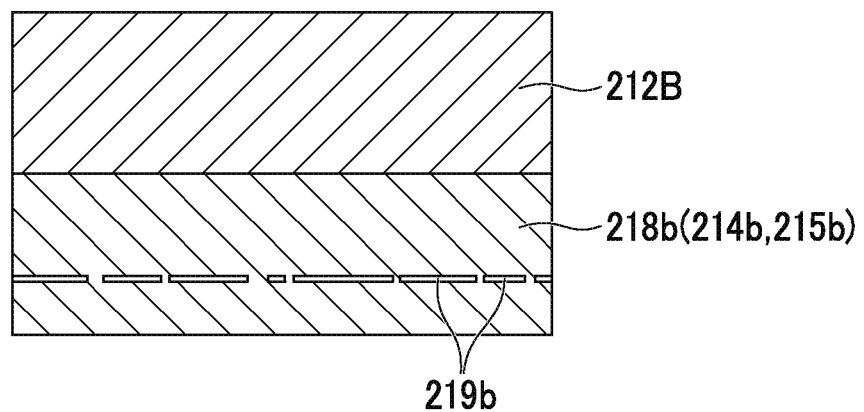
FIG. 11 is an enlarged explanatory diagram showing an interface between an intermetallic compound layer in FIG. 9 and the second copper layer.

In the above-described embodiment, the case in which the oxides 19a are dispersed at the bonding interface between the intermetallic compound layer 13C and the copper layer (first copper layer 13B) along the bonding interface in a layered state and the oxides 19b are dispersed at the bonding interface between the intermetallic compound layer 12C and the copper layer (second copper layer 12B) along the bonding interface in a layered state has been described. However, for example, as shown in FIGS. 10 and 11, along the interface between intermetallic compound layer 213C and copper layer (first copper layer 213B), oxides 219a may be dispersed inside the $\zeta_2$ phase 218a, the δ phase 214a, or the $\gamma_2$ phase 215a in a layered state, and along the interface between intermetallic compound layer 212C and copper layer (second copper layer 212B), oxides 219b may be dispersed inside the $\zeta_2$ phase 218b, the δ phase 214b, or the $\gamma_2$ phase 215b in a layered state. These oxides 219a and 219b are aluminum oxides such as alumina ($Al_2O_3$) or the like.

EXAMPLES

Hereinafter, the description will be made with respect to results of confirmation experiments that have been performed to confirm the effects of the present invention.

In the following manner, power modules of Examples 1 to 6, and Comparative Examples 1 and 2 were prepared.

In Examples 1 and 5, a circuit layer was formed by bonding an aluminum plate (thickness: 0.4 mm) to a first surface of a ceramic substrate (thickness: 0.635 mm) composed of AlN with an Al—Si-based brazing material interposed therebetween. In Example 1, an aluminum plate of 4N—Al was used, and in Example 2, an aluminum plate of 2N—Al was used. Next, a first aluminum layer was formed by bonding the aluminum plate of 4N—Al (thickness: 0.2 mm) to a second surface of the ceramic substrate with the Al—Si-based brazing material interposed therebetween. Further, a metal layer was formed by bonding a copper plate composed of Cu (oxygen-free copper) to the first aluminum layer by solid-phase diffusion bonding. The thus-obtained power module substrate and a heat sink were bonded by Sn—Sb soldering. In Example 1, the heat sink was composed of oxygen-free copper, and in Example 5, a heat sink composed of an Al alloy (A6063) with Ni plating was used. The circuit layer and the semiconductor device were bonded by soldering and heat-sink-attached power modules of Examples 1 and 5 were prepared.

In Examples 2 to 4 and 6, a second aluminum layer and a first aluminum layer were respectively formed by bonding aluminum plates (thickness: 0.2 mm) composed of materials shown in Table 1 to the first surface and the second surface of ceramic substrate (thickness: 0.635 mm) composed of materials shown in Table 1 with an Al—Si-based brazing material interposed therebetween. Further, a circuit layer and a metal layer were respectively formed by bonding copper plates (thickness: 0.2 mm) composed of Cu (oxygen-free copper) to the second aluminum layer and the first aluminum layer by solid-phase diffusion bonding. Heat sinks shown in Table 1 were bonded to the thus-obtained power module substrates by Sn—Sb soldering and semiconductor devices were bonded to the circuit layers by soldering to obtain heat-sink-attached power modules of Examples 2 to 4 and 6. In Example 6, a heat sink composed of an Al alloy (A6063) was subjected to Ni plating and then the power module substrate and the heat sink were bonded by soldering.

The above-described solid-phase diffusion bonding was performed in the vacuum heating furnace at a pressure of $10^{-6}$ Pa to $10^{-3}$ Pa.

In Comparative Example 1, a power module substrate was prepared in which a circuit layer and a metal layer were respectively formed by bonding aluminum plates (thickness: 0.4 mm) composed of 4N—Al to a first surface and a second surface of a ceramic substrate (thickness: 0.635 mm) composed of AlN with an Al—Si-based brazing material interposed therebetween. A heat sink composed of oxygen-free copper was bonded to the power module substrate by Sn—Sb soldering. Then, the circuit layer and a semiconductor device were bonded by soldering to obtain a heat-sink-attached power module of Comparative Example 1.

In Comparative Example 2, a power module substrate was prepared in which a circuit layer and a metal layer were respectively formed by bonding copper plates (thickness: 0.4 mm) composed of oxygen-free copper to a first surface and a second surface of a ceramic substrate (thickness: 0.635 mm) composed of AlN by an active metal brazing method using a Ag—Cu—Ti-based brazing material. Further, a heat sink composed of oxygen-free copper was bonded to the power module substrate by Sn—Sb soldering. Then, the circuit layer and a semiconductor device were bonded by soldering to obtain a heat-sink-attached power module of Comparative Example 2.

The semiconductor device was an IGBT device having a size of 12.5 mm×9.5 mm and a thickness of 0.25 mm.

The obtained heat-sink-attached power modules were subjected to the following evaluation tests.
(Cooling and Heating Cycle Test)

A cooling and heating cycle test was performed by using a thermal shock testing apparatus TSB-51 manufactured by ESPEC Corporation, the cycles were repeated at −40° C. for 5 minutes and in 125° C. for 5 minutes in liquid phase (Fluorinert) with respect to the power modules and 3000 cycles were performed.
(Bonding Rate Evaluation)

In Examples 1 to 6 and Comparative Examples 1 and 2, the bonding rate at the interface between the circuit layer and the metal layer in each of the power modules after the cooling and heating cycle test was evaluated by using an ultrasonic flaw detection apparatus and calculated from the following equation. Further, in Examples 1 and 2, the bonding rate at the interface between the circuit layer and the metal layer in each of the power modules after the cooling and heating cycle test was evaluated.

Here, the initial bonding area referred to an area on which the metal layer will be bonded, that is, the area of the metal layer in the examples. In addition, when the bonding rate at the interface between the ceramic substrate and the circuit layer was evaluated, the area of the circuit layer was set to the initial bonding area. Since the peeling-off was indicated by a white portion in the bonding portion in an ultrasonic flaw detection image, the area of the white portion was set as a peeled off area. When cracks initiate in the ceramic substrate, the metal layer and the solder layer, these cracks are shown as white portions in the ultrasonic flaw detection image and these cracks are also evaluated as a peeled off area.

(Bonding rate (%))={(initial bonding area)−(peeled off area)}/(initial bonding area)

(Thermal Resistance Evaluation)

The thermal resistance was measured as follows. As a semiconductor device, a heater chip was used and the heater chip was heated at a power level of 100 W and the temperature of the heater chip was measured by using thermocouple. In addition, the temperature of the cooling medium (ethylene:water=9:1) which flowed in the heat sink was measured. Then, a value obtained by dividing the difference between the temperature of the heater chip and the temperature of the cooling medium by the power was set to the thermal resistance and an increase in thermal resistance after the cooling and heating cycle test was performed was obtained.

(Power Cycle Test)

With respect to Examples 2 and 1, a power cycle test was performed. The power cycle test was performed in the following manner. That is, in a state in which the temperature and the flow amount of cooling water in the cooling portion (cooler) were constant, the electric conduction to the IGBT device was controlled to repeat a cycle in which the temperature of the device surface when the current was applied (ON) reached 140° C. and the temperature of the device surface when the current was not applied (OFF) reached 80° C. at an interval of 10 seconds, and the cycle was repeated 100,000 times.

The thermal resistance before and after the power cycle test was performed was measured and an increase rate of the thermal resistance was obtained.

The above-described evaluation results are shown in Tables 1 and 2.

As shown in Table 1, in Examples 1 to 6, since the metal layer had the first aluminum layer and the first copper layer, it could be confirmed that the bonding rate between the ceramic substrate and the metal layer after the cooling and heating cycle test and the bonding rate between the metal layer and the solder layer after the cooling and heating cycle test were satisfactory and a power module having high reliability was obtained.

On the other hand, in Comparative Example 1, since the metal layer was composed of only 4N—Al, the bonding rate between the ceramic substrate and the metal layer after the cooling and heating cycle test was satisfactory. However, an increase rate of the thermal resistance was increased as compared with Examples 1 to 6. In addition, in Comparative Example 2, since the metal layer was composed of only oxygen-free copper, fracturing occurred in the ceramic substrate after the cooling and heating cycle.

In addition, as shown in Table 2, it was confirmed that the increase rate of the thermal resistance after the power cycle could be decreased in Example 2 in which the circuit layer had the second aluminum layer and the second copper layer, as compared with Example 1 in which the circuit layer was composed of only 4N—Al.

INDUSTRIAL APPLICABILITY

According to the present invention, it is possible to provide a power module substrate capable of preventing

TABLE 1

| | Circuit layer | | | Metal layer | | | Cooling and heating cycle test | |
| --- | --- | --- | --- | --- | --- | --- | --- | --- |
| | Second aluminum layer | Second copper layer | Ceramic substrate | First aluminum layer | First copper layer | Heat sink | Bonding rate between ceramic substrate and metal layer | Thermal resistance increase rate |
| Example 1 | 4N—Al | — | AlN | 4N—Al | Oxygen-free copper | Oxygen-free copper | 98% | 9% |
| Example 2 | 4N—Al | Oxygen-free copper | AlN | 4N—Al | Oxygen-free copper | Oxygen-free copper | 97% | 10% |
| Example 3 | 4N—Al | Oxygen-free copper | Alumina | 4N—Al | Oxygen-free copper | Oxygen-free copper | 99% | 8% |
| Example 4 | 4N—Al | Oxygen-free copper | $Si_3N_4$ | 4N—Al | Oxygen-free copper | Oxygen-free copper | 96% | 12% |
| Example 5 | 2N—Al | — | AlN | 4N—Al | Oxygen-free copper | Al (Ni plating) | 96% | 13% |
| Example 6 | 4N—Al | Oxygen-free copper | AlN | 4N—Al | Oxygen-free copper | Al (Ni plating) | 98% | 15% |
| Comparative Example 1 | 4N—Al | — | AlN | 4N—Al | — | Oxygen-free copper | 99% | 35% |
| Comparative Example 2 | — | Oxygen-free copper | AlN | — | Oxygen-free copper | Oxygen-free copper | Ceramic substrate fractured | 17% |

TABLE 2

| | Circuit layer | | | Metal layer | | | Cooling and heating cycle test Bonding rate | Power cycle test |
| --- | --- | --- | --- | --- | --- | --- | --- | --- |
| | Second aluminum layer | Second copper layer | Ceramic substrate | First aluminum layer | First copper layer | Heat sink | between ceramic substrate and circuit layer | Thermal resistance increase rate |
| Example 2 | 4N—Al | Oxygen-free copper | AlN | 4N—Al | Oxygen-free copper | Oxygen-free copper | 98% | 0.7% |
| Example 1 | 4N—Al | — | AlN | 4N—Al | Oxygen-free copper | Oxygen-free copper | 97% | 7.8% | cracks from initiating in solder for bonding a metal layer and a heat sink during loading of a cooling and heating cycle, preventing a decrease in bonding reliability and an increase in thermal resistance, and preventing fracturing from occurring in a ceramic substrate, a heat-sink-attached power module substrate, and a heat-sink-attached power module.

REFERENCE SIGNS LIST

1 HEAT-SINK-ATTACHED POWER MODULE
3 SEMICONDUCTOR DEVICE
10, 110 POWER MODULE SUBSTRATE
11 CERAMIC SUBSTRATE
12, 112 CIRCUIT LAYER
12A, 112A SECOND ALUMINUM LAYER
12B, 112B SECOND COPPER LAYER
13 METAL LAYER
13A FIRST ALUMINUM LAYER
13B FIRST COPPER LAYER
30, 130 HEAT-SINK-ATTACHED POWER MODULE SUBSTRATE
31 HEAT RADIATING PLATE (HEAT SINK)
40, 140 HEAT SINK
41 COOLING PORTION (HEAT SINK)

The invention claimed is:

1. A power module substrate comprising:
a ceramic substrate;
a circuit layer that is formed on one surface of the ceramic substrate; and
a metal layer that is formed on the other surface of the ceramic substrate,
wherein the metal layer includes:
a first aluminum layer that is bonded to the other surface of the ceramic substrate,
a first copper layer that is bonded to the first aluminum layer by solid-phase diffusion bonding, and
a first intermetallic compound layer that is formed at a first bonding interface between the first aluminum layer and the first copper layer and that has a plurality of intermetallic compounds of Cu and Al,
wherein the plurality of intermetallic compounds in the first intermetallic compound layer are formed in a layered state and are laminated along the first bonding interface, and
the plurality of intermetallic compounds in the first intermetallic compound layer have a structure in which a θ phase, a η2 phase, and at least one phase selected from the group consisting of a ζ2 phase, a δ phase, and γ2 phase are sequentially laminated from the first aluminum layer toward the first copper layer.

2. The power module substrate according to claim 1, wherein the circuit layer includes:
a second aluminum layer that is bonded to one surface of the ceramic substrate, and
a second copper layer that is bonded to the second aluminum layer by solid-phase diffusion bonding.

3. A heat-sink-attached power module substrate comprising:
the power module substrate according to claim 1; and
a heat sink,
wherein the first copper layer and the heat sink are bonded.

4. The heat-sink-attached power module substrate according to claim 3,
wherein the heat sink is composed of Cu or a Cu alloy and the power module substrate and the heat sink are bonded by soldering.

5. The heat-sink-attached power module substrate according to claim 3,
wherein the heat sink is composed of Al or an Al alloy with Ni plating formed thereon and the power module substrate and the heat sink are bonded by soldering.

6. A heat-sink-attached power module comprising:
the heat-sink-attached power module substrate according to claim 3; and
a semiconductor device that is bonded to one surface of the circuit layer.

7. A heat-sink-attached power module comprising:
the heat-sink-attached power module substrate according to claim 4; and
a semiconductor device that is bonded to one surface of the circuit layer.

8. A heat-sink-attached power module comprising:
the heat-sink-attached power module substrate according to claim 5; and
a semiconductor device that is bonded to one surface of the circuit layer.

9. The power module substrate according to claim 1, wherein
a thickness of the first intermetallic compound layer is 1 μm to 80 μm.

10. The power module substrate according to claim 1, wherein
oxides are dispersed in a layered state between the first aluminum layer and the first copper layer.

11. The power module substrate according to claim 10, wherein
the oxides are dispersed in a layered state along the first bonding interface between the first intermetallic compound layer and the first copper layer.

12. The power module substrate according to claim 1, wherein
an average crystal grain size of the first aluminum layer is 500 μm or more, and
an average crystal grain size of the first copper layer is 50 μm to 200 μm.

13. The power module substrate according to claim 2, wherein
an average crystal grain size of the second aluminum layer is 500 μm or more, and
an average crystal grain size of the second copper layer is 50 μm to 200 μm.

14. The power module substrate according to claim 2, wherein
a second intermetallic compound layer is formed at a second bonding interface between the second aluminum layer and the second copper layer and has a plurality of intermetallic compounds of Cu and Al,
wherein the plurality of intermetallic compounds in the second intermetallic compound layer are formed in a layered state and are laminated along the second bonding interface.

15. The power module substrate according to claim 14, wherein
the plurality of intermetallic compounds in the second intermetallic compound layer have a structure in which a θ phase, a η2 phase, and at least one phase selected from the group consisting of a ζ2 phase, a δ phase, and a γ2 phase are sequentially laminated from the second aluminum layer toward the second copper layer.

16. The power module substrate according to claim 2, wherein
oxides are dispersed in a layered state between the second aluminum layer and the second copper layer.

17. The power module substrate according to claim 16, wherein
the oxides are dispersed in a layered state along the second bonding interface between the second intermetallic compound layer and the second copper layer.

18. The power module substrate according to claim 15, wherein
oxides are dispersed in a layered state between the second aluminum layer and the second copper layer.

19. The power module substrate according to claim 18, wherein
the oxides are dispersed in a layered state inside one of the $\zeta_2$ phase, the $\delta$ phase, and a $\gamma_2$ phase along the second bonding interface between the second intermetallic compound layer and the second copper layer.

20. The power module substrate according to claim 14, wherein
a thickness of the second intermetallic compound layer is 1 μm to 80 μm.

21. A power module substrate comprising:
a ceramic substrate;
a circuit layer that is formed on one surface of the ceramic substrate; and
a metal layer that is formed on the other surface of the ceramic substrate,
wherein the metal layer includes:
a first aluminum layer that is bonded to the other surface of the ceramic substrate,
a first copper layer that is bonded to the first aluminum layer by solid-phase diffusion bonding, and
a first intermetallic compound layer that is formed at a first bonding interface between the first aluminum layer and the first copper layer and that has a plurality of intermetallic compounds of Cu and Al,
wherein the plurality of intermetallic compounds in the first intermetallic compound layer are formed in a layered state and are laminated along the first bonding interface,
wherein an average crystal grain size of the first aluminum layer is 500 μm or more, and
wherein an average crystal grain size of the first copper layer is 50 μm to 200 μm.

22. The power module substrate according to claim 21, wherein the circuit layer includes
a second aluminum layer that is bonded to one surface of the ceramic substrate, and
a second copper layer that is bonded to the second aluminum layer by solid-phase diffusion bonding.

23. A heat-sink-attached power module substrate comprising:
the power module substrate according to claim 21; and
a heat sink,
wherein the first copper layer and the heat sink are bonded.

24. A heat-sink-attached power module comprising:
the heat-sink-attached power module substrate according to claim 23; and
a semiconductor device that is bonded to one surface of the circuit layer.

25. The power module substrate according to claim 22, wherein
an average crystal grain size of the second aluminum layer is 500 μm or more, and
an average crystal grain size of the second copper layer is 50 μm to 200 μm.

* * * * *